United States Patent
Han et al.

(10) Patent No.: US 12,334,897 B2
(45) Date of Patent: Jun. 17, 2025

(54) BULK-ACOUSTIC WAVE RESONATOR

(71) Applicant: SAMSUNG ELECTRO-MECHANICS CO., LTD., Suwon-si (KR)

(72) Inventors: Sang Heon Han, Suwon-si (KR); Won Han, Suwon-si (KR); Chang Hyun Lim, Suwon-si (KR); Sung Joon Park, Suwon-si (KR); Jae Goon Aum, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 894 days.

(21) Appl. No.: 17/495,169

(22) Filed: Oct. 6, 2021

(65) Prior Publication Data

US 2022/0407492 A1 Dec. 22, 2022

(30) Foreign Application Priority Data

Jun. 16, 2021 (KR) .................. 10-2021-0078143

(51) Int. Cl.
*H01L 41/047* (2006.01)
*H03H 9/02* (2006.01)
(Continued)

(52) U.S. Cl.
CPC ........ *H03H 9/02015* (2013.01); *H03H 9/131* (2013.01); *H03H 9/48* (2013.01);
(Continued)

(58) Field of Classification Search
CPC ............... H03H 9/02015; H03H 9/131; H10N 30/708; H10N 30/871
See application file for complete search history.

(56) References Cited

U.S. PATENT DOCUMENTS 10,727,809 B2   7/2020   Sadhu et al.
2013/0127300 A1   5/2013   Umeda et al.
(Continued)

FOREIGN PATENT DOCUMENTS

CN   112953437 A   6/2021
JP   5817673 B2   11/2015
(Continued)

OTHER PUBLICATIONS

Taiwanese Office Action issued on Jun. 7, 2022 in corresponding Taiwanese Patent Application No. 110138581 (4 pages in English, 4 pages in Taiwanese).

*Primary Examiner* — Bryan P Gordon
(74) *Attorney, Agent, or Firm* — NSIP Law (57) ABSTRACT

A bulk-acoustic wave (BAVV) resonator is provided. The BAW includes a substrate, a first electrode disposed on the substrate, a piezoelectric layer disposed to cover at least a portion of the first electrode, and a second electrode disposed to cover at least a portion of the piezoelectric layer, wherein the piezoelectric layer includes an intermediate layer, a first layer disposed above the intermediate layer and a second layer disposed below the intermediate layer, the first layer and the second layer are symmetrical in relation to a plane through which a central line of the intermediate layer passes in a thickness direction, and a thickness of the intermediate layer is greater than a thickness of each of the first and second layers.

19 Claims, 9 Drawing Sheets

(51) Int. Cl.
    *H03H 9/13*     (2006.01)
    *H03H 9/48*     (2006.01)
    *H10N 30/00*     (2023.01)
    *H10N 30/87*     (2023.01)

(52) U.S. Cl.
    CPC ......... *H10N 30/708* (2024.05); *H10N 30/871* (2023.02); *H03H 9/133* (2013.01)

(56) References Cited

U.S. PATENT DOCUMENTS

| | | |
|---|---|---|
| 2015/0381144 A1 | 12/2015 | Bradley et al. |
| 2017/0025596 A1 | 1/2017 | Qiu et al. |
| 2018/0013397 A1* | 1/2018 | Lim ........................ H03H 9/171 |
| 2018/0041189 A1* | 2/2018 | Lee .......................... H03H 9/54 |
| 2018/0115302 A1* | 4/2018 | Yeh ........................ H03H 9/173 |
| 2018/0254764 A1* | 9/2018 | Lee ........................ H03H 9/174 |
| 2020/0389150 A1* | 12/2020 | Wang .................... H03H 9/174 |
| 2021/0028766 A1 | 1/2021 | Hurwitz et al. |
| 2021/0075398 A1 | 3/2021 | Lee et al. |

FOREIGN PATENT DOCUMENTS

| | | |
|---|---|---|
| KR | 10-2018-0015338 A | 2/2018 |
| KR | 10-2018-0101129 A | 9/2018 |
| KR | 10-2021-0029644 A | 3/2021 |

\* cited by examiner

FIG. 12

BULK-ACOUSTIC WAVE RESONATOR

CROSS-REFERENCE TO RELATED APPLICATIONS

This application claims the benefit under 35 USC § 119(a) of Korean Patent Application No. 10-2021-0078143 filed on Jun. 16, 2021 in the Korean Intellectual Property Office, the entire disclosure of which is incorporated herein by reference for all purposes.

BACKGROUND

1. Field

The following description relates to a bulk-acoustic wave (BAW) resonator.

2. Description of Related Art

BAW filters are elements that may allow a desired frequency band in radio frequency (RF) signals in front end modules such as smartphones and tablets to pass therethrough, and which may block unwanted frequency bands.

In order to pass a desired frequency band, and block unwanted frequency bands more efficiently, sharp skirt characteristics may be beneficial only in a specific frequency band, e.g., closely related to $kt^2$ (electromechanical coupling coefficient) performance of BAW resonators forming BAW filters and Q performance.

Therefore, various structures have been developed to improve the $kt^2$ performance of BAW resonators.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a bulk-acoustic wave (BAW) resonator, includes a substrate; a first electrode disposed on the substrate; a piezoelectric layer disposed to cover at least a portion of the first electrode; and a second electrode disposed to cover at least a portion of the piezoelectric layer, wherein: the piezoelectric layer comprises an intermediate layer, a first layer disposed on the intermediate layer, and a second layer disposed below the intermediate layer, the first layer and the second layer are symmetrical in relation to a plane through which a central line of the intermediate layer passes in a thickness direction, and a thickness of the intermediate layer is greater than a thickness of each of the first layer and the second layer.

The first layer and the second layer may be formed of a same material.

The first layer and the second layer may have a same thickness.

The intermediate layer may be formed of a material different from the material of the first layer and the material of the second layer.

The first layer and the second layer may have a same density, a same stiffness, and a same Young's moduli.

The first layer may include a plurality of first sublayers, the second layer may include a plurality of second sublayers, and the first sublayers and the second sublayers may each have a thickness that is less than a thickness of the intermediate layer.

A first sublayer of the plurality of first sublayers, and a second sublayer of the plurality of second sublayers corresponding to each other, may have a same thickness.

A first sublayer of the plurality of first sublayers, and a second sublayer of the plurality of second sublayers corresponding to each other, may have a same density, a same stiffness, and a same Young's moduli.

The intermediate layer is formed of a material different from a material of the first layer and a material of the second layer, and each sublayer of the plurality of first sublayers are formed of different materials.

A membrane layer may be configured to form a cavity together with the substrate, and disposed below the first electrode; and a passivation layer may be disposed over at least a portion of the second electrode.

An insertion layer may be disposed between the membrane layer and the first electrode.

An insertion layer may be disposed between the first electrode and the piezoelectric layer.

An insertion layer may be disposed between the piezoelectric layer and the second electrode.

An insertion layer may be disposed between the second electrode and the passivation layer.

An etch stop layer may be disposed to surround the cavity; and a sacrificial layer may be disposed outside the etch stop layer.

Each of the intermediate layer, the first layer, and the second layer may be formed of a rare earth metal-doped material, or at least the intermediate layer among the intermediate layer, the first layer, and the second layer may be formed of a rare earth metal-doped material.

A content of the rare earth metal doped in the intermediate layer may be greater than a content of the rare earth metal doped in the first layer and the second layer.

The intermediate layer, the first layer, and the second layer may be respectively formed of any one of aluminum nitride (AlN), zinc oxide (ZnO), and lead zirconium titanium oxide (PZT; PbZrTiO), and may respectively be any one of scandium (Sc), erbium (Er), yttrium (Y), and lanthanum (La).

In a general aspect, a bulk-acoustic wave (BAW) resonator includes a substrate; a first electrode disposed on the substrate; a piezoelectric layer disposed to cover at least a portion of the first electrode; and a second electrode disposed to cover at least a portion of the piezoelectric layer, wherein: the piezoelectric layer comprises an intermediate layer, a first layer disposed on the intermediate layer, and a second layer disposed below the intermediate layer, and the first layer and the second layer are configured such that rates of vertical waves moving to the first layer and the second layer are similar to each other.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Figure 1:
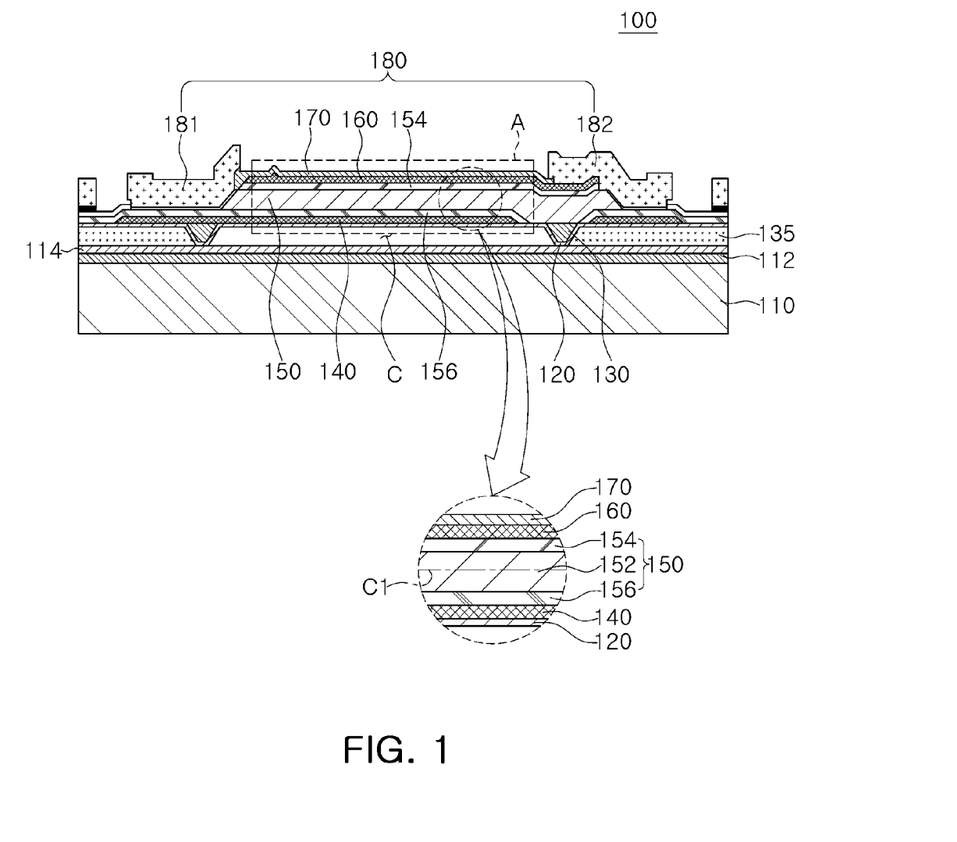
FIG. 1 is an example schematic cross-sectional view illustrating an example bulk-acoustic wave (BAVV) resonator, in accordance with one or more embodiments.

FIG. 1 is an example schematic cross-sectional view illustrating an example bulk-acoustic wave (BAVV) resonator 100, in accordance with one or more embodiments.

Referring to FIG. 1, the example BAW resonator 100, in accordance with one or more embodiments, may include, in one or more examples, a substrate 110, a membrane layer 120, a sacrificial layer 130, an etch stopper 135, a first electrode 140, a piezoelectric layer 150, a second electrode 160, a passivation layer 170, and a metal pad 180. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The substrate 110 may include a base 112 and a substrate protective layer 114 formed on an upper surface of the base 112. The base 112 may be, as a non-limiting example, a silicon substrate. In one or more examples, a silicon wafer or a silicon-on-insulator (SOI) type substrate may be implemented as the base 112.

The substrate protective layer 114 may be formed on the upper surface of the base 112 and may electrically isolate the base 112 from a component disposed thereon. Additionally, the substrate protective layer 114 may help to prevent the base 112 from being etched by an etching gas when a cavity C is formed during a manufacturing process.

In one or more examples, the substrate protective layer 114 may be formed of at least one of silicon dioxide ($SiO_2$), silicon nitride ($Si_3N_4$), aluminum oxide ($Al_2O_2$), and aluminum nitride (AlN), and may be formed through any one of, as only examples, chemical vapor deposition, RF magnetron sputtering, and evaporation.

The membrane layer 120 may form the cavity C with the substrate 110. Additionally, the membrane layer 120 may be formed of a material which has low reactivity with an etching gas when a portion of the sacrificial layer 130 is removed. In one or more examples, the membrane layer 120 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

In one or more examples, a seed layer (not shown), formed of aluminum nitride (AlN), may be formed on the membrane layer 120. That is, the seed layer may be disposed between the membrane layer 120 and the first electrode 140. The seed layer may also be formed with a dielectric material having an HCP crystal structure or a metal other than aluminum nitride (AlN). In one or more examples, when the seed layer is a metal, the seed layer may be formed of titanium (Ti).

However, in one or more examples, an example in which the membrane layer 120 is implemented is described as an example. However, in one or more examples, the membrane layer 120 may not be implemented, and only the seed layer may be implemented. In one or more examples, the seed layer may form the cavity C together with the substrate 110, and the first electrode 140 may be stacked on the seed layer.

In one or more examples, the sacrificial layer 130 may be formed on the substrate protective layer 114, and the cavity C and the etch stopper 135 may be disposed inside the sacrificial layer 130. The cavity C may be formed by removing a portion of the sacrificial layer 130 during an example manufacturing process embodiment. As described above, since the cavity C is formed inside the sacrificial layer 130, the first electrode 140 disposed on the sacrificial layer 130 may be formed to be flat.

The etch stopper 135 may be disposed along a boundary of the cavity C. The etch stopper 135 may prevent etching from proceeding beyond a cavity region during a cavity C formation process.

The first electrode 140 may be formed on the membrane layer 120, and a portion of the first electrode 140 may be disposed at an upper portion of the cavity C. In one or more examples, the first electrode 140 may be implemented as any one of an input electrode and an output electrode that inputs and outputs electrical signals such as radio frequency (RF) signals.

In one or more examples, the first electrode 140 may be formed using, for example, a conductive material such as molybdenum (Mo) or alloys thereof. However, one or more examples are not limited thereto, and the first electrode 140 may be formed of a conductive material such as ruthenium (Ru), tungsten (W), iridium (Ir), platinum (Pt), copper (Cu), titanium (Ti), tantalum (Ta), nickel (Ni), chromium (Cr), or alloys thereof.

The piezoelectric layer 150 may be formed to cover at least a portion of the first electrode 140 that is disposed at the upper portion of the cavity C. The piezoelectric layer 150 may be a portion in which a piezoelectric effect that converts electrical energy into mechanical energy in the form of acoustic waves occurs, and may include, in an example, aluminum nitride (AlN) material.

Additionally, the piezoelectric layer 150 may include an intermediate layer 152, a first layer 154 disposed on the intermediate layer 152, and a second layer 156 disposed below the intermediate layer 152.

In one or more examples, the intermediate layer 152 may be formed of, as a non-limiting example, an aluminum nitride material doped with scandium. In one or more examples, the intermediate layer 152 may be formed of an AlScN material having a scandium content of 10 wt %. Additionally, the first layer 154 and the second layer 156 may be formed of pure aluminum nitride (AlN).

However, the one or more examples are not limited thereto, and may include examples in which the content of scandium doped in the intermediate layer 152 is more than the content of scandium doped in the first and second layers 154 and 156. In one or more examples, when the intermediate layer 152 is formed of an AlScN material having a scandium content of 20 wt %, the respective first and second layers 154 and 156 may be formed of an AlScN material which has a scandium content of 10 wt % or a pure aluminum nitride (AlN) material.

In one or more examples, when the intermediate layer 152 is formed of an AlScN material having a scandium content of 30 wt %, the respective first and second layers 154 and 156 may be formed of an AlScN material having a scandium content of 10 wt %, an AlScN material having a scandium content of 20 wt %, or pure aluminum nitride (AlN) material. In one or more examples, when the intermediate layer 152 is formed of an AlScN material having a scandium content of 40 wt %, the respective first and second layers 154 and 156 may be formed of an AlScN material having a scandium content of 10 wt %, an AlScN material having a scandium content of 20 wt %, an AlScN material having a scandium content of 30 wt %, or a pure aluminum nitride (AlN) material.

In one or more examples, the doped material is not limited to scandium (Sc), and may be any one of erbium (Er), yttrium (Y), and lanthanum (La). Furthermore, such an example in which the intermediate layer 152 and the respective first and second layers 154 and 156 are formed of aluminum nitride (AlN) is described as an example. However, one or more examples are not limited thereto, and the intermediate layer 152 and the respective first and second layers 154 and 156 may be formed of one of zinc oxide (ZnO), lead zirconium titanium oxide (PZT; PbZrTiO).

In one or more examples, the first layer 154 and the second layer 156 may be symmetrical with respect to a plane including a center line C1 in a thickness direction of the intermediate layer 152. In one or more examples, the first layer 154 and the second layer 156 may have the same thickness. Also, the first layer 154 and the second layer 156 may have the same density, stiffness, and Young's moduli.

In one or more examples, the thickness direction refers to a direction from the substrate 110 of the BAW resonator 100 toward the second electrode 160.

In one or more examples, a thickness of the intermediate layer 152 has a thickness greater than each of the respective first and second layers 154 and 156 having the same thickness.

As described above, since the first and second layers 154 and 156 respectively disposed on and under the intermediate layer 152 may have a symmetrical structure, $kt^2$ performance, unique characteristics of the BAW resonator 100, may be finely adjusted by adjusting the material and thickness of the first and second layers 154 and 156.

Additionally, since the first and second layers 154 and 156 may have a symmetrical structure, a rate of a wavelength generated in a vertical direction may be uniform. Accordingly, high piezoelectric efficiency may be implemented by reducing loss occurring due to a phase mismatch between the respective wavelengths.

Specifically, when the intermediate layer 152 and the respective first and second layers 154 and 156 have the same material and the same thickness, the first and second layers 154 and 156 may each include at least one or more layers. Here, if $kt^2$ performance of the intermediate layer 152 is higher than $kt^2$ performance of the first and second layers 154 and 156, the $kt^2$ performance of the intermediate layer 152 is similar to the $kt^2$ performance of the first and second layers 154 and 156 as the thickness of the first and second layers 154 and 156 decreases, and is lowered as the thickness of the first and second layers 154 and 156 increases.

In one or more examples, a rate of a vertical wave generated during an operation of the BAW resonator 100 is as outlined in Equation 1 below:

$$v = \sqrt{\frac{c}{\rho}}$$ Equation 1

$$c = \frac{(1-v)E}{(1+v)(1-2v)}$$

In one or more examples, ρ is density, c is stiffness, E is Young's Moduli, and v is the Poisson's ratio.

The example BAW resonator 100 may have a piezoelectric layer 150 disposed between the first electrode 140 and the second electrode 160, and an air layer may be disposed at an upper portion and a lower portion of the first electrode 140 and the second electrode 160, so that a large difference is made in acoustic impedance. Additionally, most vertical waves may be reflected from a boundary with the air layer, and may travel toward the piezoelectric layer 150. Accordingly, the vertical wave generated by the piezoelectric layer 150 and the vertical wave reflected from the boundary with the air layer meet each other to form a standing wave, thereby achieving resonance driving with reduced loss.

As can be seen from Equation 1 above, if there is a difference in the thickness, density (ρ), and stiffness (c) between the first and second layers 154 and 156, rates of waves traveling to an upper side and a lower side of the piezoelectric layer 150 may be different, and may therefore result in loss due to interference of each wavelength. Accordingly, in order to reduce the resulting loss, the first and second layers 154 and 156 may be adjusted to be symmetrical with respect to the plane including the center line C1 in the thickness direction of the intermediate layer 152. In other words, the first and second layers 154 and 156 may be adjusted to be symmetrical with respect to the plane including the center line C1 of the intermediate layer 152 in the thickness direction so that rates of the vertical waves traveling in the first and second layers 154 and 156 may be the same or similar to each other.

Figure 2:
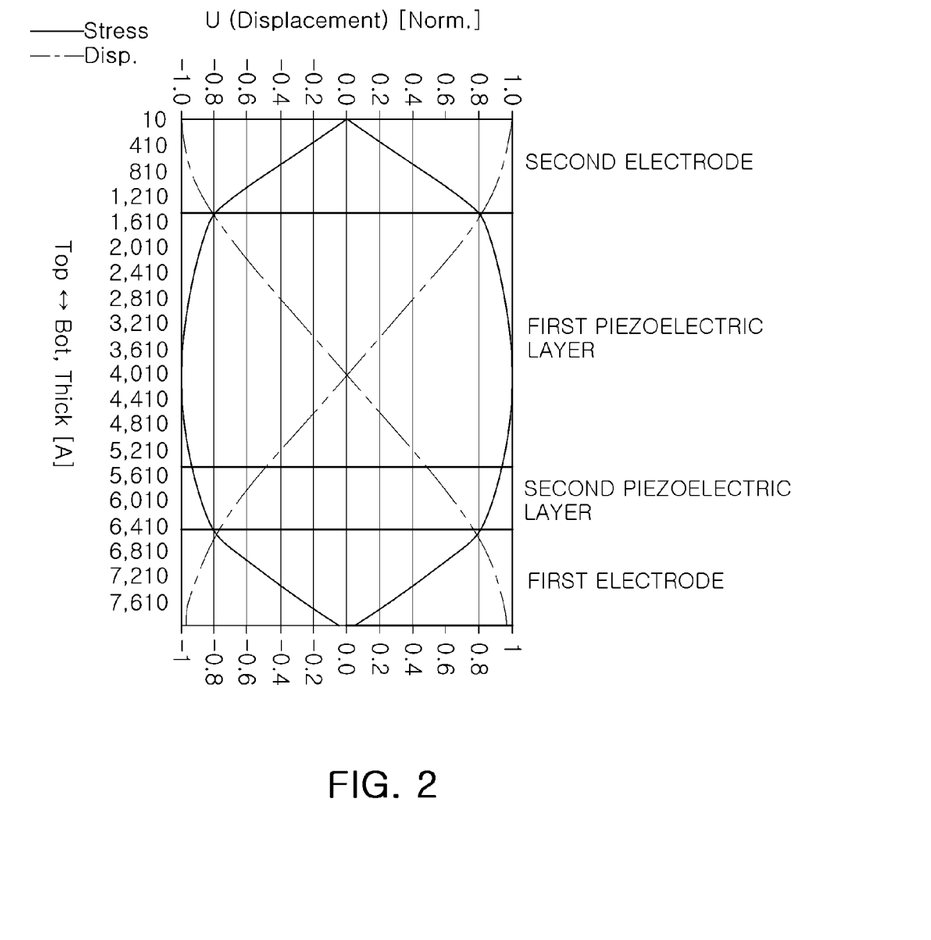
FIG. 2 is a graph illustrating stress and displacement when a typical piezoelectric layer includes a first piezoelectric layer and a second piezoelectric layer having a different thickness from a thickness of the first piezoelectric layer.
Figure 3:
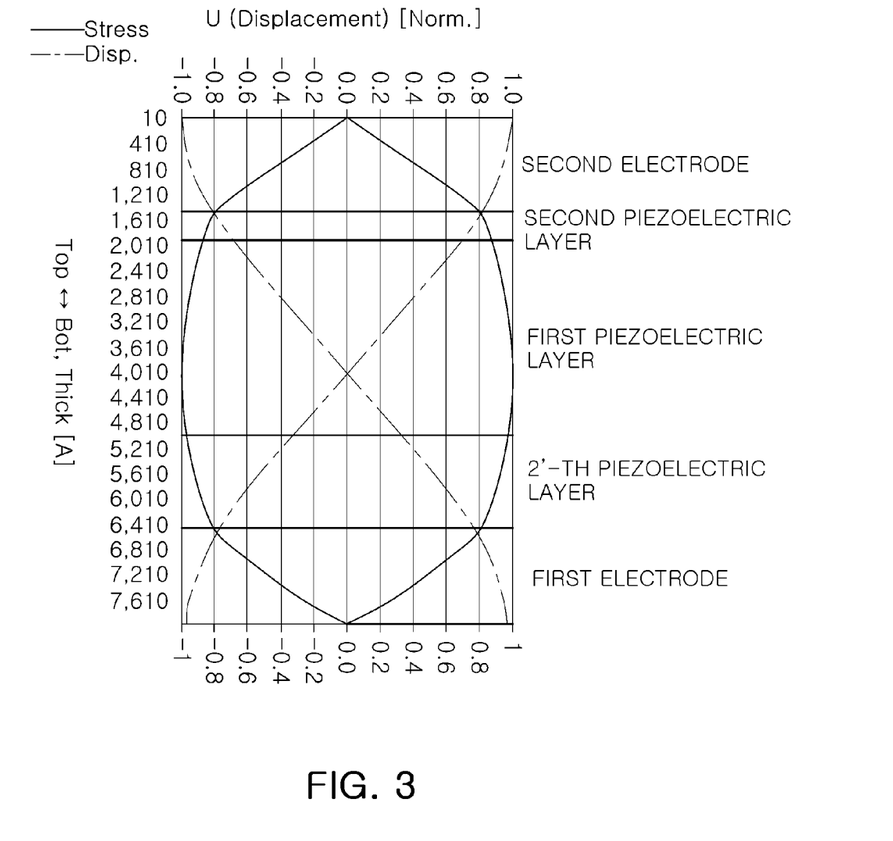
FIG. 3 is a graph illustrating stress and displacement when a typical piezoelectric layer includes first, second, and third piezoelectric layers and the first and third piezoelectric layers have an asymmetric structure.
Figure 4:
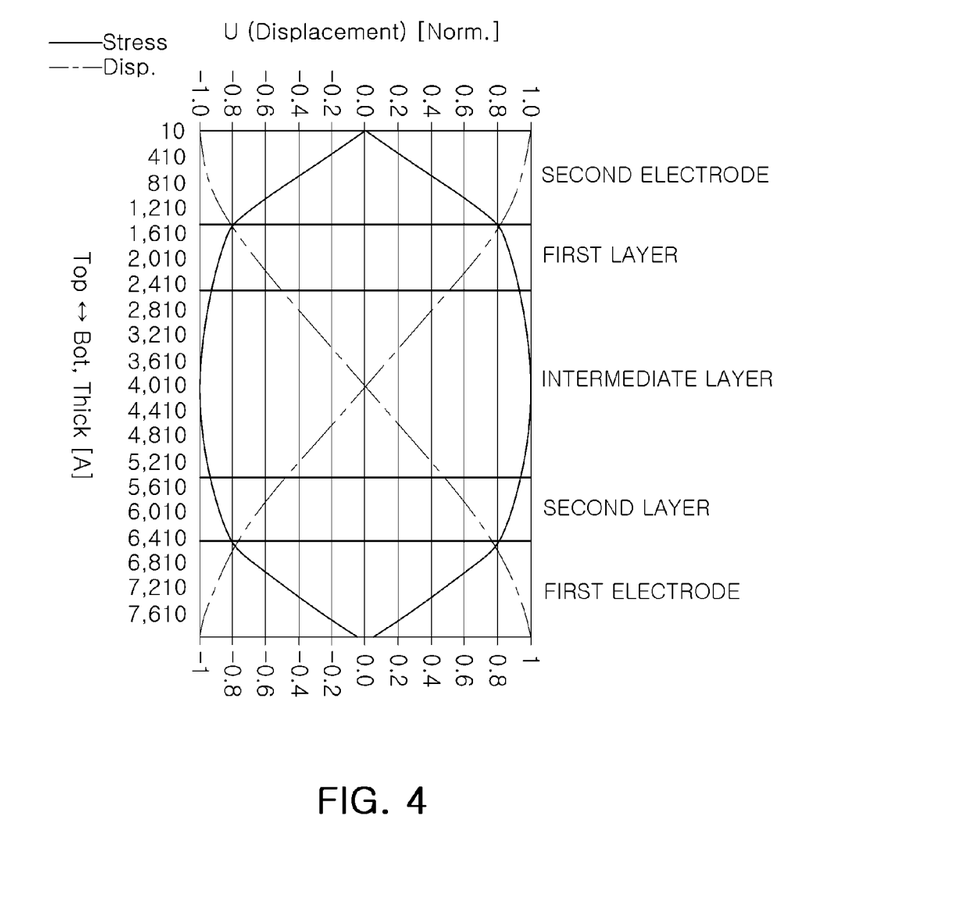
FIG. 4 is an example graph illustrating stress and displacement of a piezoelectric layer provided in an example BAW resonator, in accordance with one or more embodiments.

The stress and displacement related to a piezoelectric layer is illustrated in FIGS. 2 to 4.

Referring to FIGS. 2 and 3, in such an example of a double piezoelectric layer structure as illustrated in FIG. 2 or an asymmetric piezoelectric layer structure as illustrated in FIG. 3, stress applied to the resonator may be asymmetric because the layers of the upper and lower portions based on the first piezoelectric layer PZL1 disposed in the center may not be symmetrical. This may induce an asymmetry of the vertical wave speed, resulting in drive loss during resonant operation.

Figure 5:
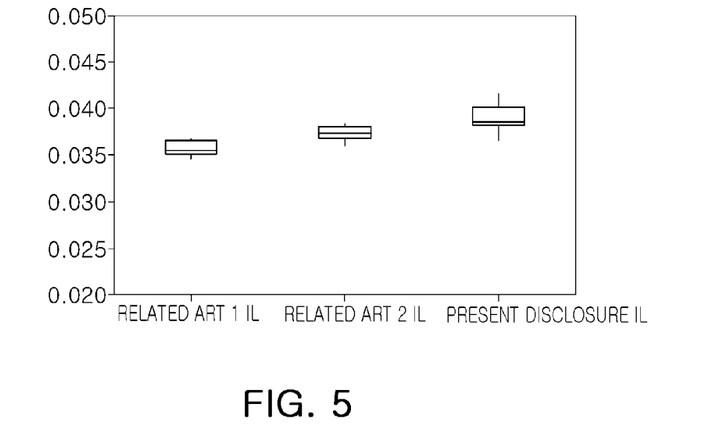
FIG. 5 is a graph illustrating insertion loss characteristics of typical BAW resonators and example resonators in accordance with one or more embodiments.

However, as illustrated in FIG. 5, it is confirmed that, when the respective first and second layers 154 and 156 are symmetrical with respect to the plane including the center line C1 in the thickness direction of the intermediate layer 152, both stress and displacement may be symmetrical, and accordingly, loss occurring in the resonator may be reduced and piezoelectric efficiency may be increased.

The second electrode 160 may be formed to cover at least the piezoelectric layer 150 disposed on the upper portion of the cavity C. The second electrode 160 may be implemented as any one of an input electrode and an output electrode that inputs and outputs an electrical signal such as a radio frequency (RF) signal. That is, when the first electrode 140 is implemented as an input electrode, the second electrode 160 may be implemented as an output electrode, and when the first electrode 140 is implemented as an output electrode, the second electrode 160 may be implemented as an input electrode.

In one or more examples, the second electrode 160 may be formed using, as non-limited examples, a conductive material such as, but not limited to, molybdenum (Mo) or alloys thereof. However, the one or more examples are not limited thereto, and the second electrode 160 may be formed of, as non-limiting examples, a conductive material such as ruthenium (Ru), tungsten (VV), iridium (Ir), platinum (Pt), copper (Cu), titanium (Ti), tantalum (Ta), nickel (Ni), chromium (Cr) or alloys thereof.

In one or more examples, the resonator may be configured to include the first electrode 140, the piezoelectric layer 150, and the second electrode 160, and may vibrate based on the piezoelectric effect of the piezoelectric layer 150.

The passivation layer 170 may be formed in a region excluding a portion of the first electrode 140 and the second electrode 160. In one or more examples, the passivation layer 170 may prevent the second electrode 160 and the first electrode 140 from being damaged during the manufacturing process.

Further, the passivation layer 170 may be partially removed by an etching process for frequency control in a final manufacturing process. Specifically, a thickness of the passivation layer 170 may be adjusted. The passivation layer 170 may be, in such an example example, a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The metal pad 180 may be formed in a portion of the first electrode 140 and the second electrode 160 in which the passivation layer 170 is not formed. As an example, the metal pad 180 may be formed of a material such as gold (Au), gold-tin (Au—Sn) alloy, copper (Cu), copper-tin (Cu—Sn) alloy, aluminum (Al), or aluminum alloy. For example, the aluminum alloy may be an aluminum-germanium (Al—Ge) alloy. The metal pad 180 may include a first metal pad 181 connected to the first electrode 140, and a second metal pad 182 connected to the second electrode 160.

As described above, since the respective first and second layers 154 and 156 that are respectively disposed on the upper and lower portions of the intermediate layer 152 may have a symmetrical structure, the $kt^2$ performance, which is a unique characteristic of the resonator 100, may be finely adjusted by adjusting the material and thickness of the respective first and second layers 154 and 156.

Additionally, since the first and second layers 154 and 156 may have a symmetrical structure, a rate of wavelengths generated in a vertical direction may be uniform. Accordingly, high piezoelectric efficiency may be implemented by reducing loss that may occur due to a phase mismatch between the respective wavelengths.

The performance of the typical BAW resonators and an example BAW resonator in accordance with one or more embodiments will now be described.

Figure 6:
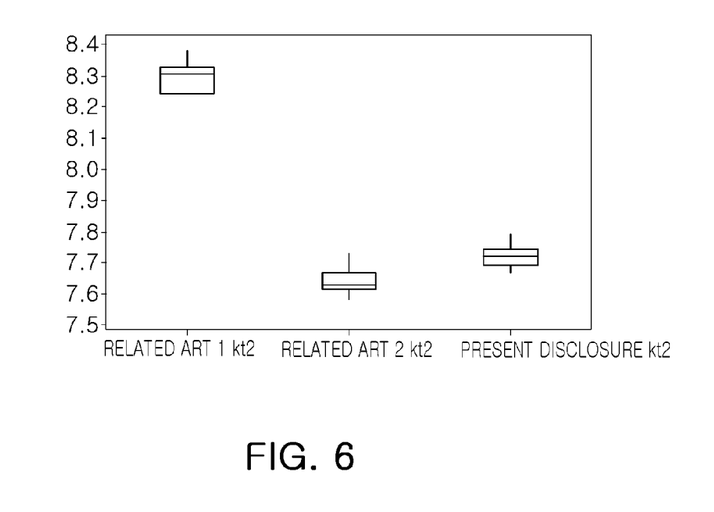
FIG. 6 is a graph illustrating $kt^2$ performance of typical BAW resonators and example BAW resonators in accordance with one or more embodiments.
Figure 7:
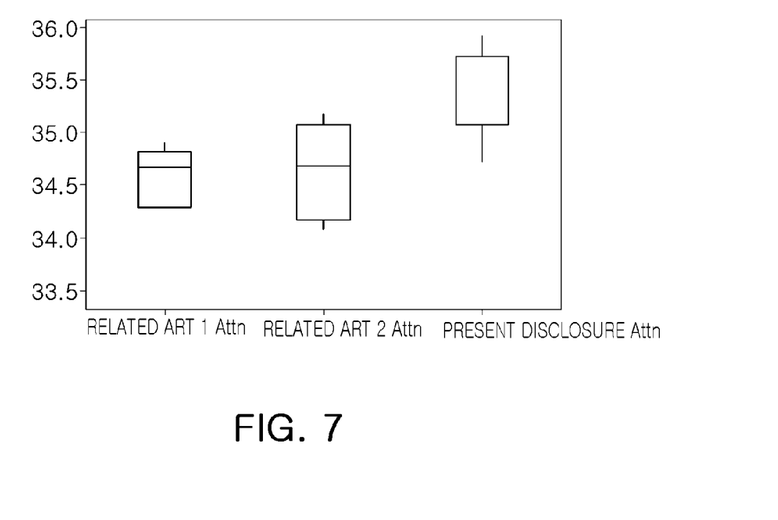
FIG. 7 is a graph illustrating damping performance of typical BAW resonators and example BAW resonators in accordance with one or more embodiments.

FIG. 5 is a graph illustrating insertion loss characteristics of the typical BAW resonators, and one or more example BAW resonators in accordance with one or more embodiments, FIG. 6 is a graph illustrating $kt^2$ performance of the typical BAW resonators and one or more example BAW resonators in accordance with one or more embodiments, and FIG. 7 is a graph illustrating damping performance of the typical BAW resonators and one or more example BAW resonators in accordance with one or more embodiments.

In FIGS. 5 to 7, Typical 1 illustrates a typical example in which the piezoelectric layer is configured as a single layer, Typical 2 illustrates a typical example in which two piezoelectric layers are configured to have different thicknesses. One or more examples illustrate such an example in which the piezoelectric layer includes the intermediate layer 152 and the respective first and second layers 154 and 156 disposed on and under the intermediate layer 152 and the respective first and second layers 154 and 156 may be symmetrical with respect to a plane including a center line C1 of the intermediate layer 152 in the thickness direction.

As illustrated in FIG. 5, the insertion loss representing Q performance at a resonance point may not be significantly different between the Typical 1 and 2 and the one or more examples. At the same time, as illustrated in FIG. 6, the $kt^2$ performance of the one or more examples may be increased to increase piezoelectric efficiency, as compared to the Typical 2. Additionally, as illustrated in FIG. 7, damping performance representing Q performance at an anti-resonance point may be increased in the one or more examples.

Hereinafter, a modified example of a BAW resonator, in accordance with one or more embodiments, will be described with reference to the drawings.

Figure 8:
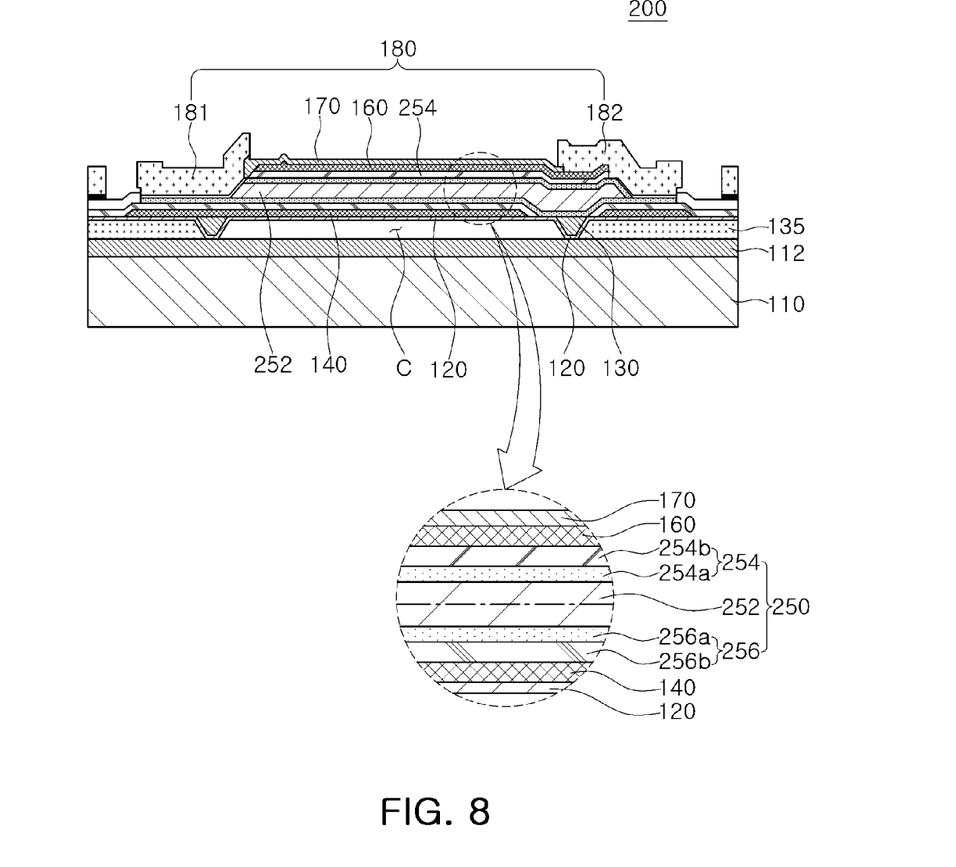
FIG. 8 is an example schematic cross-sectional view illustrating an example BAW resonator, in accordance with one or more embodiments.

FIG. 8 is a schematic cross-sectional view illustrating an example BAW resonator, in accordance with one or more embodiments.

Referring to FIG. 8, the example BAW resonator 200, in accordance with one or more embodiments, may include, as an example, a substrate 110, a membrane layer 120, a sacrificial layer 130, an etch stopper 135, a first electrode 140, a piezoelectric layer 250, a second electrode 160, a passivation layer 170, and a metal pad 180.

The substrate 110, the membrane layer 120, the sacrificial layer 130, the etch stopper 135, the first electrode 140, the second electrode 160, the passivation layer 170, and the metal pad 180 are substantially the same as the components provided in the example BAW resonator 100 described above, and thus, a detailed description thereof is omitted and will be replaced with the above description.

The piezoelectric layer 250 may be formed to cover at least the first electrode 140 disposed at an upper portion of the cavity C. The piezoelectric layer 150 is an element in which a piezoelectric effect that converts electrical energy into mechanical energy in the form of acoustic waves occurs, and may include, as a non-limiting example, an aluminum nitride (AlN) material.

The piezoelectric layer 250 may include an intermediate layer 252, a first layer 254 disposed on the intermediate layer 252, and a second layer 256 disposed below the intermediate layer 252.

In one or more examples, the intermediate layer 252 may be formed of a material different from materials of the respective first and second layers 254 and 256. Additionally, the intermediate layer 252 may be formed of an aluminum nitride material doped with scandium. In one or more examples, the intermediate layer 252 may be formed of an AlScN material having a scandium content of 10 wt %. Additionally, in a non-limiting example, the first layer 254 and the second layer 256 may be formed of pure aluminum nitride (AlN).

However, the one or more examples are not limited thereto and may include examples in which the content of scandium doped in the intermediate layer 252 is more than the content of scandium contained in the respective first and second layers 252 and 254.

The first layer 254 may include a plurality of first sublayers, and the second layer 256 may include a plurality of second sublayers. In a non-limited example, the first sublayer may include a 1-1-th sublayer 254a and a 1-2-th sublayer 254b disposed on the 1-1-th sublayer 254a, and the second sublayer may include a 2-1-th sublayer 256a and a 2-2-th sublayer 256b disposed below the 2-1-th sublayer 256a.

The 1-1-th sublayer 254a and the 2-1-th sublayer 256a may be symmetrical with respect to a plane including the center line C1 of the intermediate layer 252 in the thickness direction. In addition, the 1-2-th sublayer 254b and the 2-2-th sublayer 256b are also symmetric with respect to the plane including the center line C1 of the intermediate layer 252 in the thickness direction. In an example, each of the 1-1-th sublayer 254a, the 1-2-th sublayer 254b, the 2-1-th sublayer 256a, and the 2-2-th sublayer 256b may have a thickness less than that of the intermediate layer 252.

Also, the 1-1-th sublayer 254a and the 1-2th sublayer 254b may have different thicknesses and may be formed of different materials.

Such an example in which the first layer 254 and the second layer 256 include two layers is described. However, one or more examples are not limited thereto, and the first layer 254 and the second layer 256 may include three or more layers.

In one or more examples, the 1-1-th sublayer 254a and the 2-1-th sublayer 256a may have the same thickness, and the 1-2-th sublayer 254b and the 2-2-th sublayer 256b may also have the same thickness.

Additionally, a first sublayer and a second sublayer corresponding to each other, among the plurality of first sublayers and the plurality of second sublayers, may have the same density, stiffness, and Young's Moduli.

FIGS. 9 to 12 are example views illustrating examples of a portion A of FIG. 1.

Figure 9:
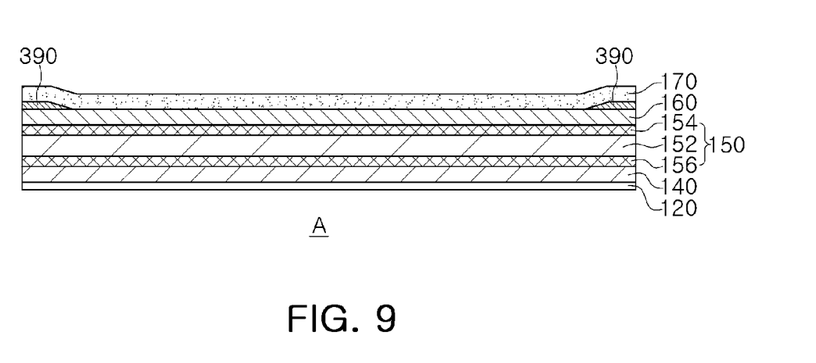
FIGS. 9 to 12 are example explanatory views illustrating an example of a portion A of FIG. 1.

As illustrated in FIG. 9, an insertion layer 390 is disposed between the second electrode 160 and the passivation layer 170. The insertion layer 390 may be formed of a dielectric material such as, but not limited to, silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), aluminum oxide ($Al_2O_3$), titanium oxide ($TiO_2$), or zinc oxide (ZnO). However, the insertion layer 390 may be formed of a material that is different from a material of the piezoelectric layer 150. Additionally, a region may be formed in which the insertion layer 390 is provided, as an empty space (air). The empty space may be implemented by removing the insertion layer 390 during the manufacturing process.

The insertion layer 390 may reflect a lateral wave generated during resonance driving toward a resonance portion. Accordingly, the insertion layer 390 may be disposed to surround an active region.

Figure 10:
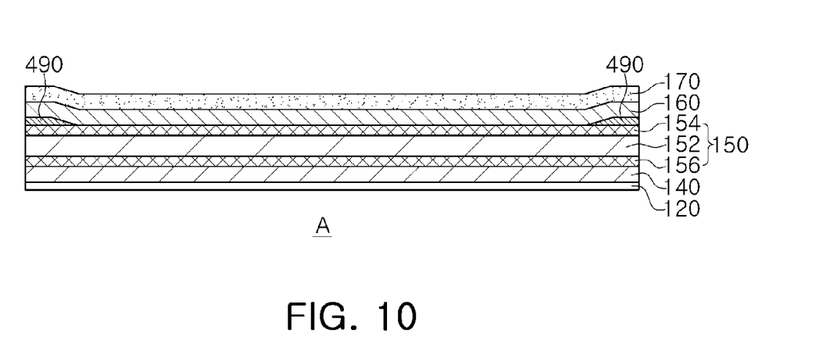

Additionally, as illustrated in FIG. 10, an insertion layer 490 may be disposed between the second electrode 160 and the piezoelectric layer 150. The insertion layer 490 may be formed of a dielectric material such as, but not limited to, silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), aluminum oxide ($Al_2O_3$), titanium oxide ($TiO_2$), or zinc oxide (ZnO), but may be formed of a material different from a material of the piezoelectric layer 150. Additionally, i a region may be formed in which the insertion layer 490 is provided, as an empty space (air). This may be implemented by removing the insertion layer 490 during the manufacturing process.

The insertion layer 490 may reflect a lateral wave generated during resonance driving toward a resonance portion. The insertion layer 490 may be disposed to surround an active region.

Figure 11:
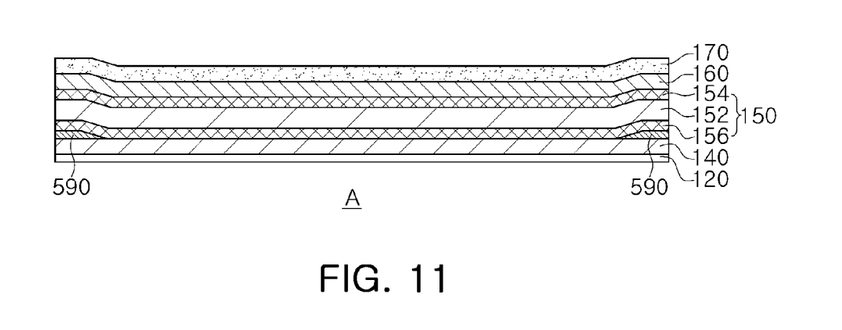

Further, as illustrated in FIG. 11, an insertion layer 590 may be disposed between the piezoelectric layer 150 and the first electrode 140. The insertion layer 590 may be formed of a dielectric material such as, but not limited to, silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), aluminum oxide ($Al_2O_3$), titanium oxide ($TiO_2$), or zinc oxide (ZnO). The insertion layer 590 may also be formed of a material different from a material of the piezoelectric layer 150. Additionally, a region may be formed in which the insertion layer 590 is provided, as an empty space (air). This may be implemented by removing the insertion layer 590 during the manufacturing process.

The insertion layer 590 may reflect a lateral wave generated during resonance driving toward a resonance portion. The insertion layer 590 may be disposed to surround an active region.

Figure 12:
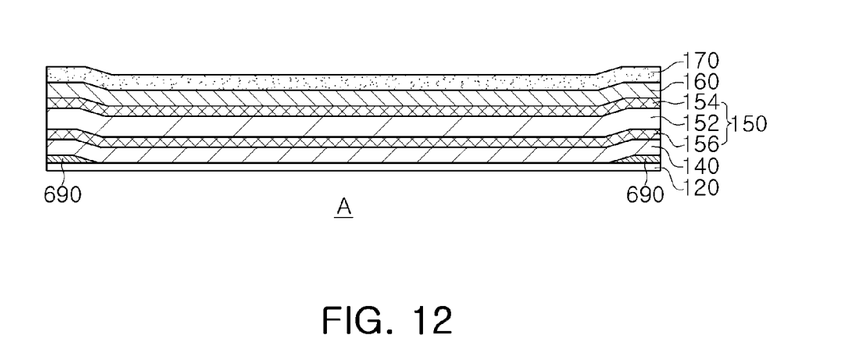

Also, as illustrated in FIG. 12, an insertion layer 690 may be disposed between the first electrode 140 and the membrane layer 120. The insertion layer 690 may be formed of a dielectric material such as, but not limited to, silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), aluminum oxide ($Al_2O_3$), titanium oxide ($TiO_2$), or zinc oxide (ZnO). The insertion layer 690 may be formed of a material different from a material of the piezoelectric layer 150. Additionally, i a region may be formed in which the insertion layer 690 is provided, as an empty space (air). This may be implemented by removing the insertion layer 690 during the manufacturing process.

The insertion layer 690 may reflect a lateral wave generated during resonance driving toward a resonance portion. The insertion layer 690 may be disposed to surround an active region.

Accordingly, in various examples, piezoelectric efficiency may be improved by reducing driving loss of the piezoelectric layer.

Additionally, in various examples, piezoelectric efficiency may be improved by adjusting fine $kt^2$ performance and condensing stress occurring inside during resonance driving to the intermediate layer.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave (BAW) resonator, comprising:
a substrate;
a first electrode disposed on the substrate;
a piezoelectric layer disposed to cover at least a portion of the first electrode; and
a second electrode disposed to cover at least a portion of the piezoelectric layer,
wherein
the piezoelectric layer comprises an intermediate layer, a first layer disposed on the intermediate layer, and a second layer disposed below the intermediate layer,
the first layer and the second layer are symmetrical in relation to a plane through which a central line of the intermediate layer passes in a thickness direction, and
a thickness of the intermediate layer is greater than a thickness of each of the first layer and the second layer.

2. The BAW resonator of claim 1, wherein the first layer and the second layer are formed of a same material.

3. The BAW resonator of claim 2, wherein the first layer and the second layer have a same thickness.

4. The BAW resonator of claim 2, wherein the intermediate layer is formed of a material different from the material of the first layer and the material of the second layer.

5. The BAW resonator of claim 1, wherein the first layer and the second layer have a same density, a same stiffness, and a same Young's moduli.

6. The BAW resonator of claim 1, wherein:
the first layer comprises a plurality of first sublayers,
the second layer comprises a plurality of second sublayers, and
the first sublayers and the second sublayers each have a thickness that is less than a thickness of the intermediate layer.

7. The BAW resonator of claim 6, wherein a first sublayer of the plurality of first sublayers, and a second sublayer of the plurality of second sublayers corresponding to each other have a same thickness.

8. The BAW resonator of claim 6, wherein a first sublayer of the plurality of first sublayers, and a second sublayer of the plurality of second sublayers corresponding to each other have a same density, a same stiffness, and a same Young's moduli.

9. The BAW resonator of claim 6, wherein
the intermediate layer is formed of a material different from a material of the first layer and a material of the second layer, and
each sublayer of the plurality of first sublayers are formed of different materials.

10. The BAW resonator of claim 1, further comprising:
a membrane layer configured to form a cavity together with the substrate, and disposed below the first electrode; and
a passivation layer disposed over at least a portion of the second electrode.

11. The BAW resonator of claim 10, further comprising:
an insertion layer disposed between the membrane layer and the first electrode.

12. The BAW resonator of claim 10, further comprising:
an insertion layer disposed between the first electrode and the piezoelectric layer.

13. The BAW resonator of claim 10, further comprising:
an insertion layer disposed between the piezoelectric layer and the second electrode.

14. The BAW resonator of claim 10, further comprising:
an insertion layer disposed between the second electrode and the passivation layer.

15. The BAW resonator of claim 10, further comprising:
an etch stop layer disposed to surround the cavity; and
a sacrificial layer disposed outside the etch stop layer.

16. The BAW resonator of claim 1, wherein each of the intermediate layer, the first layer, and the second layer are formed of respective rare earth metal-doped materials, or at least the intermediate layer among the intermediate layer, the first layer, and the second layer is formed of a rare earth metal-doped material.

17. The BAW resonator of claim 16, wherein a content of the rare earth metal-doped in the intermediate layer is greater than a content of corresponding the rare earth metals doped in the first layer and the second layer.

18. The BAW resonator of claim 16, wherein
the intermediate layer, and the first layer, and the second layer are respectively formed of any one of aluminum nitride (AlN), zinc oxide (ZnO), and lead zirconium titanium oxide (PZT; PbZrTiO), and are respectively doped with any one of scandium (Sc), erbium (Er), yttrium (Y), and lanthanum (La).

19. A bulk-acoustic wave (BAW) resonator, comprising:
a substrate;
a first electrode disposed on the substrate;
a piezoelectric layer disposed to cover at least a portion of the first electrode; and
a second electrode disposed to cover at least a portion of the piezoelectric layer,
wherein
the piezoelectric layer comprises an intermediate layer, a first layer disposed on the intermediate layer, and a second layer disposed below the intermediate layer, and
the first layer and the second layer are configured such that rates of vertical waves moving to the first layer and the second layer are similar to each other.

* * * * *